United States Patent
Kataoya et al.

(10) Patent No.: US 6,331,673 B1
(45) Date of Patent: *Dec. 18, 2001

(54) SOLAR CELL MODULE HAVING A SURFACE SIDE COVERING MATERIAL WITH A SPECIFIC NONWOVEN GLASS FIBER MEMBER

(75) Inventors: Ichiro Kataoya, Kyoto-fu; Takahiro Mori, Ikoma; Satoru Yamada; Hidenori Shiotsuka, both of Kyoto-fu; Ayako Komori, Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/731,571

(22) Filed: Oct. 16, 1996

(30) Foreign Application Priority Data

Oct. 17, 1995 (JP) .................................................. 7-293315
Jan. 10, 1996 (JP) .................................................. 8-018283

(51) Int. Cl.⁷ .................. H01L 31/0203; H01L 31/0236
(52) U.S. Cl. ...................... 136/259; 136/251; 136/256; 257/433; 438/26; 438/64; 438/29; 438/71
(58) Field of Search .................................. 136/251, 259, 136/256; 257/433, 788, 789, 790; 438/64, 118, 127, 26, 29, 71; 156/285

(56) References Cited

U.S. PATENT DOCUMENTS

| | | | |
|---|---|---|---|
| 4,147,560 | * 4/1979 | Gochermann | 136/251 |
| 5,474,620 | * 12/1995 | Nath et al. | 136/251 |
| 5,480,494 | * 1/1996 | Inoue | 136/251 |
| 5,530,264 | 6/1996 | Kataoka et al. | 257/40 |
| 5,582,653 | 12/1996 | Katyaoka et al. | 136/251 |
| 5,597,422 | 1/1997 | Kataoka et al. | 136/259 |
| 5,650,019 | * 7/1997 | Yamada et al. | 136/251 |
| 5,660,645 | 8/1997 | Mori et al. | 136/251 |

FOREIGN PATENT DOCUMENTS

| | | | |
|---|---|---|---|
| 60001875 | 1/1985 | (JP) . | |
| 07 288333 | 10/1995 | (JP) . | |
| 88481 | * 5/1985 | (JP) | 136/256 |
| 87033756 | 7/1987 | (JP) | H01L/31/04 |

OTHER PUBLICATIONS

Willis, et al., Annual Report, "Investigation of Test Methods, Material Properties, and Processes for Solar Cell Encapsulant", p. 10–1, Jun. 1979 (U.S. Dept. of Energy).

* cited by examiner

Primary Examiner—Nam Nguyen
Assistant Examiner—Michael C. Miggins
(74) Attorney, Agent, or Firm—Fitzpatrick, Cella, Harper & Scinto

(57) ABSTRACT

A solar cell module comprising a solar cell element and at least a surface side covering material positioned on the light receiving face side of said solar cell element, said surface side covering comprising at least a filler, a nonwoven glass fiber member, and a surface protective film, wherein said nonwoven glass fiber member has a texture bonded with an acrylic resin or is treated with a silane coupling agent.

24 Claims, 6 Drawing Sheets

SOLAR CELL MODULE HAVING A SURFACE SIDE COVERING MATERIAL WITH A SPECIFIC NONWOVEN GLASS FIBER MEMBER

BACKGROUND OF THE INVENTION

1. Field of the Invention

The present invention relates to a highly reliable solar cell module having an improved surface side covering material with a specific nonwoven glass fiber member. More particularly, the present invention relates to a highly reliable solar cell module having an improved surface side covering material with a specific nonwoven glass fiber member comprising a nonwoven glass fiber member having a texture bonded with a resin binder or a nonwoven glass fiber member treated with a silane coupling agent, which excels in exterior appearance, resistance to scratching (hereinafter referred to as scratch resistance), inflammability, weatherability, light resistance, and heat resistance.

2. Related Background Art

In recent years, the societal consciousness for the problems relating to the environment and energy has been increasing all over the world. Particularly, global-warming because of the so-called greenhouse effect due to an increase of atmospheric $CO_2$ has been predicted to cause a serious problem. In view of this, there is an increased demand for a means of power generation capable of providing clean energy without causing $CO_2$ buildup.

Now, public attention has been focused on solar-cells capable of serving as a non-exhaustable power generation source for supplying electric power without causing global-warming while meeting demand.

In order to use a solar cell as a power generation source, it is usually designed into a solar cell module in a desired configuration which can be used as the power generation source. Such a solar cell module has been widely used as the power generation source by installing it, for instance, on the ground or on a roof of a building.

Now, there are known solar cell modules in which an amorphous silicon solar cell element is used. Such a solar cell module is usually provided with a light transmissive surface side covering material on the light incident side face to protect the solar cell element. The surface side covering material is required to have (1) sufficient transparency for visible light used in solar cell power generation, (2) sufficient resistance to scratching to prevent the solar cell element enclosed in the solar cell module from suffering from externally applied stresses such as external scratching, external shock, and the like, (3) sufficient weatherability to protect the solar cell element without deteriorating use outdoors, and (4) sufficient non-flammability such that the surface side covering material itself is hardly burned.

It is known to use a glass member as an outermost surface covering material of a solar cell module.

In the case where the glass member is used as the outermost surface covering material of a solar cell module in which an amorphous silicon solar cell element is used (this solar cell module will be hereinafter referred to as amorphous silicon solar cell module), because the glass member is heavy, poor in flexibility and costly, the advantages of the amorphous silicon solar cell element, in that the amorphous silicon solar cell element is light a flexible and inexpensive, cannot be fully used. For this reason, as the outermost surface side covering material of the amorphous silicon solar cell module, a transparent thin film of a fluoride polymer is used. In this case, a transparent organic polymer such as EVA (ethylene-vinyl acetate copolymer) or the like as a filler is usually disposed inside the transparent thin film as the outermost surface side covering material. As the filler, it is usually used such a transparent organic polymer which is less expensive and which therefore can be used in a large amount in order to seal the amorphous silicon solar cell element in the amorphous silicon solar cell module. A preferable example of the transparent organic polymer used as the filler is said EVA which excels in heat resistance and weatherability.

The above, mentioned fluoride polymer thin film used as the outermost surface covering material excels in weatherability and repellency. In addition, the use of the fluoride polymer thin film as the outermost surface covering material provides an advantage to diminish the reduction of the photoelectric conversion efficiency of the solar cell module because of a reduction in the light transmittance due to resin's yellowing or clouding based on deterioration of the resin or due to surface stain. It is also an advantage that it is possible to attain an amorphous silicon solar cell module excelling in flexibility.

In the case of using a resin film such as a fluoride polymer thin film or the like as the outermost surface covering material of a solar cell module, the scratch resistance thereof is inferior to that of a solar cell having an outermost surface covering material comprising a glass member. In order to eliminate this problem, a nonwoven fiber member such as a nonwoven glass fiber member is often impregnated into a resin used as a filler.

Now, to use a nonwoven glass fiber member comprising a CRANE GLASS 230 (trademark name) together with a binder comprising a vinyl alcohol resin in an amount of 10 wt. % or more as a constituent of a surface covering material (including a glass member situated at the outermost surface side) of a solar cell module is described, for example, in Annual Report "Investigation of Test Methods, Material Properties, and Processes for Solar Cell Encapsulant", page 10–1, June 1979 (published by U.S. Department of Energy), or in Final Report on the Investigation of Proposed Process Sequence for the Array Antomated Assembly task, page 233, August 1980 (published by U.S. Department of Energy) (these will be hereinafter referred to as Reference 1).

The use of the nonwoven glass fiber member in Reference 1 is aimed not at improving the resistance to scratching of the solar cell module but principally at (a) ensuring a certain distance between the solar cell element and the glass member, (b) electrically isolating the solar cell element from the outside, and (c) attaining a pathway for deaeration in the vacuuming process in the production of the solar cell module.

Further, Japanese Unexamined Patent Publication No. 1875/1985 (hereinafter referred to as Reference 2) discloses the use of a glass fiber member by impregnating it into a filler upon the production of a solar cell module using a plurality of solar cell elements and a glass member as the outermost surface covering material by way of lamination process, in order to solve problems in that in the lamination process, the cell elements are moved to cause mutual contact between adjacent cell elements, or their strings are moved to externally raise through a glass member situated on the outermost surface side.

Further in addition, Japanese Patent Publication No. 33756/1987 (hereinafter referred to as Reference 3) discloses a solar cell module covered by a surface protective film of a transparent organic polymer resin as its outermost surface layer, which is produced by arranging two glass fiber members having slight end portions on opposite surfaces of a photovoltaic element and pouring an organic polymer resin on the resultant.

However, the prior art disclosed in References 1 to 3 have problems as will be described below.

In the case of Reference 1, the layer constituted by the nonwoven glass fiber member (the CRANE GLASS 230) and the vinyl alcohol binder in an amount 10 wt. % or more is readily markedly colored in an atmosphere with high temperature, resulting in reducing the photoelectric conversion efficiency of the solar cell module.

In the case of Reference 2, because the glass member is used as the outermost surface covering material, in the case of a solar cell module in which an amorphous silicon solar cell element is used, the advantages of the amorphous silicon solar cell element in that it is light and flexible cannot be fully used, as previously described.

In the case of Reference 3, since one glass fiber member is disposed on the light receiving face side of the photovoltaic element as above described, in order for the surface side covering material of the solar cell module to have sufficient scratch resistance, it is necessary to increase the amount of the organic polymer resin used or thicken the thickness of the glass fiber member. However, to increase the amount of the organic polymer resin entails a problem in that the surface side covering material of the solar cell module becomes inferior in non-flammability.

To thicken the glass fiber member causes a problem in that the glass fiber member is often raised to expose to the outside through the surface protective film when the solar cell module is continuously used in outdoors over a long period of time. Particularly, the portion of the glass fiber member which is extended to externally expose through the surface protective film is free of a transparent organic polymer resin as an adhesive, and the surface protective film and a portion of the photovoltaic element situated under said portion of the glass fiber member is free of a transparent organic polymer resin as a filler. Therefore, interfacial portions of the solar cell module where said portion of the glass fiber member is involved are insufficiently adhered. Because of this, moisture is liable to invade into the inside of the solar cell module, resulting in deteriorating the characteristics of the photovoltaic element and a leakage current is caused through the moisture.

Hence, the solar cell module according to Reference 3 is problematic in terms of reliability when it is continuously used outdoors over a long period of time, specifically over about 20 years from the viewpoint that the lifetime of a solar cell module as a power generation source is generally considered to be 20 years. Further, recently, there is a demand for a solar cell module as a power generation source to have a 50 year lifetime outdoors. The solar cell module according to Reference 3 apparently cannot meet this demand.

A solar cell module having an outermost surface covering material comprising an organic polymer resin film is more likely to have problems due to moisture in comparison with the case of a solar cell module having an outermost surface covering material comprising a glass member. Said troubles include that the organic polymer resin film as the outermost surface covering material is liable to allow moisture to permeate therethrough into the inside of the solar cell module, and that moisture invades through pinholes of the organic polymer resin film into the inside of the solar cell module. The latter problem is serious in that in the case where the moisture invaded contains an electrolyte, when it reaches the solar cell element, the electrical insulation between the solar cell element and the outside is broken to leak electrical current to the outside.

Incidentally, for (i) a conventional solar cell module (of 3600 $cm^2$ in area) comprising a solar cell element sealed by an organic sealing resin and a surface side covering material comprising an organic polymer resin film as an outermost surface protective film an& a nonwoven glass fiber member situated under the outermost surface protective film in which an organic sealing resin is present between the organic polymer resin film and the nonwoven glass fiber member and (ii) another conventional solar cell module (of 3600 $cm^2$ in area) comprising a solar cell element and a surface side covering material comprising an organic polymer resin film as an outermost surface protective film but having no nonwoven glass fiber member in which an organic sealing resin is present between the organic polymer resin film and the solar cell element, the present inventors observed electric insulation resistance between the outermost surface protective film and the solar cell element of each solar cell module in the following manner. For each solar cell module, the initial electric insulation resistance between the outermost surface protective film and the solar cell element was measured. Then, the surface covering material of each solar cell module was immersed in service water for 32 days, during which the electric insulation resistance between the outermost surface protective film and the solar cell element was measured after the immersion in the service water for 2 days, 4 days, 8 days, 16 days, and 32 days. The measured electric insulation resistances for each solar cell module are collectively shown in Table 1.

From the measured results shown in Table 1, it is understood that in the case of the solar cell module (i) with the nonwoven glass fiber member, the electric insulation resistance between the outermost surface protective film and the solar cell element is markedly reduced as the water immersion period is increased. One of the reasons for this is considered to be that moisture which invaded through pinholes of the outermost surface protective film passes through the interface between the organic sealing resin and the nonwoven glass fiber member to reach the solar cell element.

In the case of the solar cell module (ii) with no nonwoven glass fiber member, it is understood that the reduction in the electric insulation resistance between the outermost surface protective film and the solar cell element is slight. This situation proves that the moisture invasion pathway in the case of the solar cell module (i) lies in the interface between the organic sealing resin and the nonwoven glass fiber member.

SUMMARY OF THE INVENTION

An object of the present invention is aimed at eliminating the foregoing problems in the prior art and providing a solar cell module having an improved surface side covering material which is free from the problems found in the prior art.

Another object of the present invention is to provide a highly reliable solar cell module characterized by having an improved surface side covering material comprising a nonwoven glass fiber member bonded with an acrylic resin which is used as a filler for sealing the light incident, side of a solar cell element, which is slightly colored in an atmosphere with high temperature and when exposed to outdoors over a long period of time and excels in exterior appearance, scratch resistance, inflammability, weatherability, light resistance, and heat resistance.

A further object of the present invention is to provide a highly reliable solar cell module characterized by having an improved surface side covering material with a specific nonwoven glass fiber member comprising a nonwoven glass fiber member having a texture bonded with an organic resin binder or a nonwoven glass fiber member treated with a silane coupling agent, which excels in exterior appearance, scratch resistance, inflammability, weatherability, light resistance, and heat resistance.

DESCRIPTION OF THE INVENTION AND PREFERRED EMBODIMENTS

Figure 1:
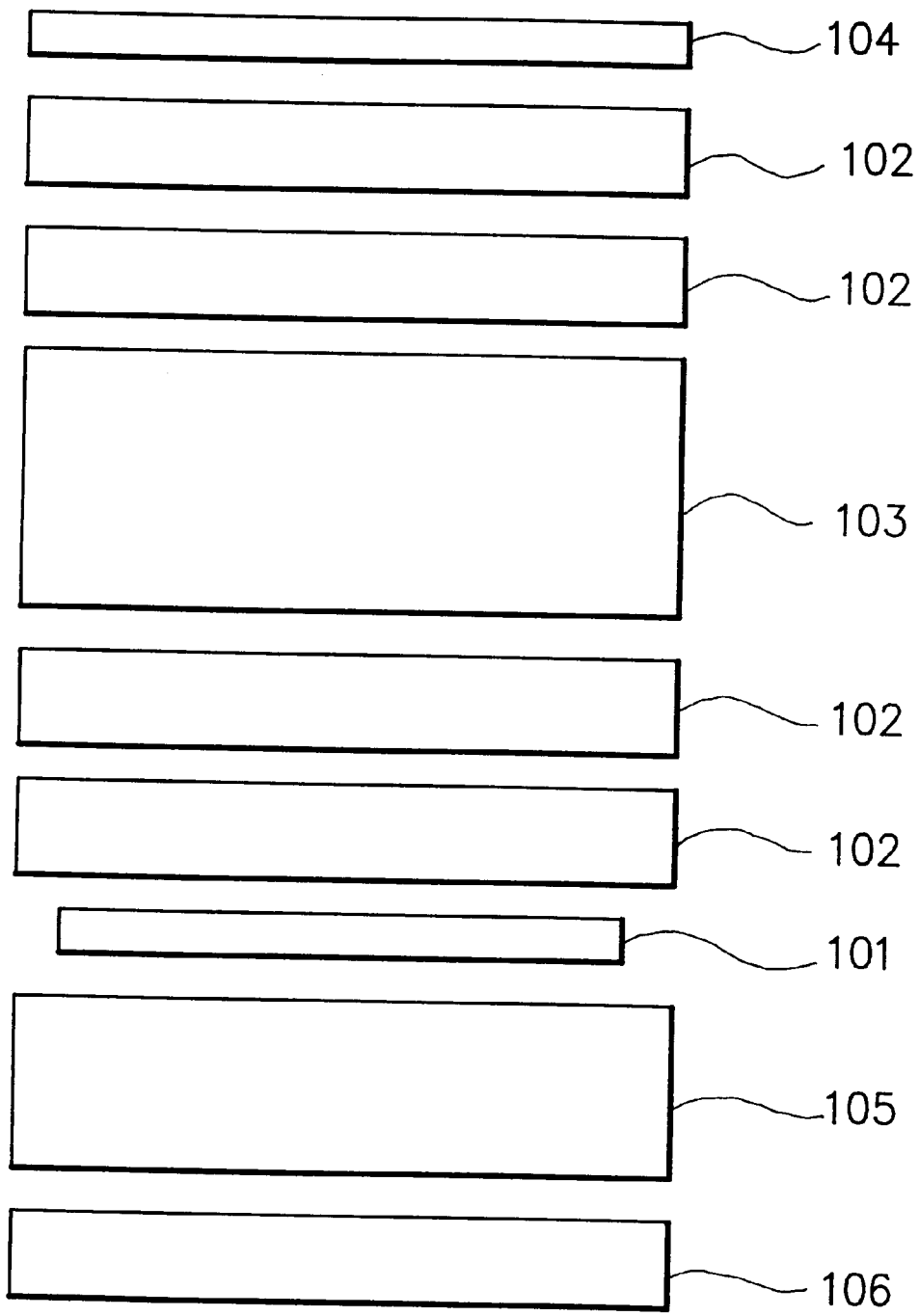
FIG. 1 is a schematic view illustrating the constitution of an example of a solar cell module according to the present invention.

The present invention is to attain the above described objects.

As above described, the present invention provides a highly reliable solar cell module characterized by having an improved surface side covering material comprising a nonwoven glass fiber member bonded with an acrylic resin which is used as a filler for sealing the light incident side of a solar cell element, which is slightly colored in an atmosphere with high temperature and when exposed to outdoors over a long period of time and excels in exterior appearance, scratch resistance, inflammability, weatherability, light resistance, and heat resistance.

A typical embodiment of the solar cell module according to the present invention is characterized by having an improved surface side covering material with a specific nonwoven glass fiber member comprising a nonwoven glass fiber member having a texture bonded with an organic resin binder or a nonwoven glass fiber member treated with a silane coupling agent, which excels in exterior appearance, scratch resistance, inflammability, weatherability, light resistance, and heat resistance.

In the present invention, there are provided such advantages as will be described below.

(1). By using an acrylic resin which is slightly colored due to light or heat as the binder for the nonwoven glass fiber member, there can be attained a solar cell module which largely maintain its photoelectric conversion efficiency when continuously used in an environment with high temperature or in outdoors over a long period of time.

(2). The nonwoven glass fiber member may be pluralized. In this case, the situation of preventing external raise of the nonwoven glass fiber member is further improved while ensuring not only the adhesion between a outermost surface protective organic resin film composed of a transparent organic polymer resin and a transparent organic polymer resin situated thereunder but also the adhesion between the transparent organic polymer resin and a solar cell element situated thereunder. Hence, there can be attained a reliable solar cell module having a desirable surface side covering material which is slightly reduced in terms of the light transmittance when continuously used in outdoors over a long period of time. In addition, the surface side covering material has an improved scratch resistance.

In the case where the nonwoven glass fiber member is pluralized and they arranged so as to contact with each other, deaeration of a stacked body in the process of producing a solar cell module can be more efficiently conducted in comparison with the case where the nonwoven glass fiber member is singly used. By this, the resulting solar cell module is such that is free of external raise of the nonwoven glass fiber member. In addition, the irregularities of the outermost surface of the solar cell module are made uniform.

(3). In the case where the nonwoven glass fiber member is made to have a thickness of 50 $\mu$m to 200 $\mu$m, the advantages described in the above (2) are improved. Particularly, the migration of an adhesive used for bonding the nonwoven glass fiber members is desirably prevented to stabilze them.

(4). When the weight ratio of the transparent organic polymer resin to the nonwoven glass fiber member is made to be 4 to 12, the use of the transparent organic polymer resin in a relatively small amount makes it possible to attain a surface cover excelling in scratch resistance. Particularly, by reinforcing the transparent organic polymer resin by means of the nonwoven glass fiber member, it is possible to decrease the thickness of the transparent organic resin while ensuring the scratch resistance.

(5). When the content of the acrylic resin in the nonwoven glass fiber member is made to be 3.0 wt. % to 6.0 wt. %, the advantages described in the above (1) and (2) are improved while preventing the nonwoven glass fiber member from scuffing so as to readily handle the nonwoven glass fiber member. Particularly, depolymerization of the resin to the nonwoven glass fiber member can be minimized.

(6). When opposite surfaces of the nonwoven glass fiber member are treated with a silane coupling agent, the adhesion at the interface between the sealing resin and the nonwoven glass fiber member is improved by means of the silane coupling agent to prevent the occurrence of a water invasion pathway.

(7). When the sealing resin comprises a hard organic resin layer with no nonwoven glass fiber member which is formed on the light receiving face side of the solar cell element and a soft organic resin layer containing the nonwoven glass fiber member which is situated over the hard organic resin layer, the effect of preventing the electric insulation resistance of the surface covering material from reducing is further improved. Particularly, even if moisture should invade through the soft organic resin layer containing the nonwoven glass fiber member, the hard organic resin layer with no nonwoven glass fiber member which is situated under the soft organic resin layer functions to prevent the moisture from reaching the solar cell element.

(8). When the sealing resin comprises an EVA (ethylene-vinyl acetate copolymer), the adhesion between the sealing resin and the nonwoven glass fiber member is further ensured. The EVA herein has been used in the surface side covering material of a conventional solar cell module, it is not necessary for the configuration of the conventional surface side covering material to be greatly modified.

(9). When the thickness of the transparent organic polymer resin is made to be 200 $\mu$m to 800 $\mu$m, there can be attained a surface side covering material which excels in inflammability. Particularly, by diminishing the amount of the organic polymer resin having a high combustion energy used, the inflammability of the surface side covering material is ensured.

(10). When the transparent outermost surface protective organic resin film is made to have a surface with a wettability index of 32 dyne/cm to 45 dyne/cm on the side of the solar cell element, there can be attained a surface cover which excels in adhesion and also in long term reliability. Particularly, the transparent outermost surface protective organic resin film and the transparent organic polymer resin situated thereunder are justified so as to improve the adhesion between the two, resulting in attaining a desirable surface cover with an excellent adhesion which is still maintained even after exposure to outdoors over a long period of time.

(11). When the transparent outermost surface protective organic resin film comprises a fluoride polymer, there can be attained a surface cover excelling in weatherability. Particularly, in this case, in combination with the transparent organic polymer resin as the filler, the weatherability of the fluoride polymer is exhibited in a desirable state.

(12). When the transparent outermost surface protective organic resin film is made to have a tensile elongation rate at brake of 200% to 800% in the lengthwise and crosswise directions in ASTM D-882 test, there can be attained an excellent outermost surface cover with no crack.

(13). When the transparent outermost surface protective organic resin film comprises a non-oriented organic resin film, there can be attained a desirable outermost surface cover which is hardly broken. This prevents the occurrence of moisture invasion through the outermost surface protective film, resulting in providing a desirable surface side covering material which is free of a reduction in the electric insulation resistance.

(14). When the transparent outermost surface protective organic resin film comprises a tetrafluoroethylene-ethylene copolymer resin, there can be attained an outermost surface cover excelling in weatherability, transparency, physical strength, and repellency. This makes it possible to attain a solar cell module having an outermost surface which is hardly polluted even upon continuous exposure to outdoors over a long period of time, where the reduction in the photoelectric conversion efficiency is prevented.

(15). When the surface side covering material is made to have an uneven outermost surface provided with a go plurality of irregularities of 5 $\mu$m to 50 $\mu$m in difference of elevation, the outermost surface protective film is prevented from being broken. This makes it possible attain a solar cell module having an outermost surface which does not allow moisture to invade therethrough into the inside, where the reduction in the photoelectric conversion efficiency is prevented.

(16). When the production of a solar cell module according to the present invention is conducted by way of thermocompression treatment using a single chambered vacuum laminater, the solar cell module can be efficiently produced by a simple manner and with a reasonable production cost.

(17). When a solar cell module is produced by way of thermocompression treatment while conducting lamination process while facing the light receiving face side of a solar cell element (or a photovoltaic element) upward, irregularities present at the light receiving face of the solar cell element can be embedded by a transparent organic polymer resin in an minimum amount. Particularly, the follow-up property of the surface side covering material toward the irregularities present at the light receiving face of the solar cell element is improved.

(18). When the solar cell element comprises a solar cell element (or a photovoltaic element) comprising a semiconductor photoactive layer formed of an amorphous silicon film and a transparent and conductive layer disposed on an electrically conductive substrate, there can be attained a solar cell module excelling particularly in flexibility.

In the following, detailed description will be made of the solar cell module according to the present invention.

FIG. 1 is a schematic cross-sectional view illustrating the constitution of a typical example of a solar cell module according to the present invention.

In FIG. 1, reference numeral 101 indicates a solar cell element (or a photovoltaic element), reference numeral 102 a nonwoven glass fiber member, reference numeral 103 a transparent or substantially transparent filler (this filler will be hereinafter referred to as surface side filler), reference numeral 104 a transparent or substantially transparent film which is positioned at the outermost surface (this film will be hereinafter referred to surface protective film or surface protective layer), reference numeral 105 a filler on the rear side of the solar cell element 101 (this filler will be hereinafter referred to as backside filler), reference numeral 106 an insulation film as a back face protective film.

In the solar cell module shown in FIG. 1, light is impinged through the side of the surface protective film 104, and the light impinged passes through the surface protective film 104, an upper layer comprising two nonwoven glass fiber members 102, the filler 103 and a lower layer comprising two nonwoven glass fiber members 102 to arrive in the solar cell element 101. A photoelectromotive force generated in the solar cell element 101 is outputted through outputting terminals (not shown).

In the solar cell module, each of the upper layer and the lower layer may comprise a single nonwoven glass fiber member.

The solar cell module shown in FIG. 1 may further comprise a back face reinforcing member (not shown in the figure) disposed on the rear side of the insulation film 106 in order to improve the physical strength of the solar cell module and also in order to prevent the solar cell module from being distorted or warped.

In the following, description will be made of each constituent of the solar cell module shown in FIG. 1.

Solar Cell Element (or Photovoltaic Element)

The solar cell element 101 (or the photovoltaic element) comprises at least a semiconductor photoactive layer as a photoelectric conversion member disposed on an electroconductive substrate.

Figure 2:
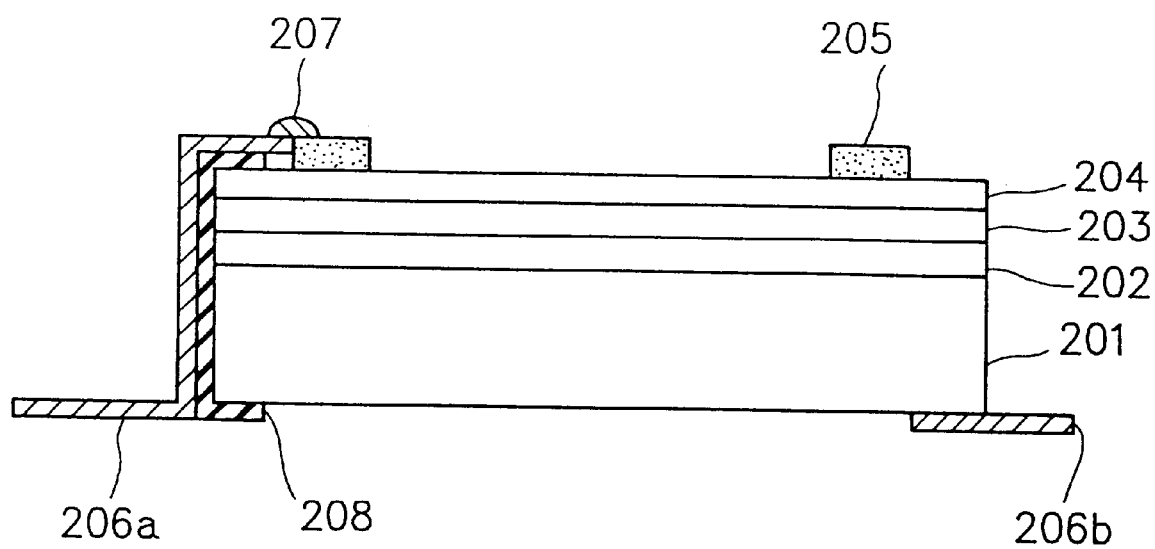
FIG. 2 is a schematic cross-sectional view illustrating the constitution of an example of a photovoltaic element (or a solar cell element) which can be used in the present invention.

FIG. 2 is a schematic cross-sectional view illustrating the constitution of such solar cell element (or photovoltaic element).

In FIG. 2, reference numeral 201 indicates an electrically conductive substrate, reference numeral 202 a back reflecting layer, reference numeral 203 a semiconductor photoactive layer, reference numeral 204 a transparent and conductive layer, reference numeral 205 a collecting electrode (or a grid electrode), reference numeral 206*a* a power outputting terminal on the positive side, reference numeral 206*b* a power outputting terminal on the negative side, reference numeral 207 a solder, and reference numeral 208 an insulation tape.

The solar cell element (or the photovoltaic element) shown in FIG. 2 comprises the back reflecting layer 202, the semiconductor photoactive layer 203, the transparent and conductive layer 204, and the collecting electrode 205 disposed in the named order on the electrically conductive substrate 201, where the outputting terminal 206*a* is electrically connected to the collecting electrode 205 by means of the solder 207 and it is extending from the collecting electrode 205 while being insulated by means of the insulation tape 208, and the outputting terminal 206*b* is electrically connected to the electrically conductive substrate 201 by means of an electrically conductive adhesive (not shown). In this configuration, the positive side power outputting terminal and the negative side power outputting terminal may be changed into a negative side power outputting terminal and a positive side power outputting terminal depending upon the constitution of the semiconductor photoactive layer.

The electrically conductive substrate 201 serves not only as a substrate for the solar cell element and also as a lower electrode. As for the electroconductive substrate 201, there is no particular restriction as long as it has an electroconductive surface. Specifically, it may be an electroconductive member composed of a metal or an electrically conductive member composed of a metal alloy of metals as stainless steel. Other than these, the electrically conductive substrate may comprise a carbon sheet or a Pb-plated steel sheet. Alternatively, the electroconductive substrate may be a film or sheet made of a synthetic resin or a sheet made of a ceramic. In this case, the substrate is deposited with an electrically conductive film or the like on the surface thereof.

The back reflecting layer 202 may comprise a metal layer, a metal oxide layer, or a two-layered structure comprising a metal layer and a metal oxide layer.

The back reflecting layer 202 is desired to have a roughened surface in order to make incident light to be effectively utilized.

The semiconductor photoactive layer 203 functions to conduct photoelectric conversion. The semiconductor photoactive layer may be composed of a single crystal silicon semiconductor material, a non-single crystal silicon semiconductor material such as an amorphous silicon semiconductor material (including a microcrystalline silicon semiconductor material) or polycrystalline silicon semiconductor material, or a compound semiconductor material. In any case, the semiconductor photoactive layer comprised of any of these semiconductor materials may be of a stacked structure with a pin junction, a pn junction or a shottky type junction.

The transparent and conductive layer 204 functions as an upper electrode. The transparent and conductive layer may comprise $In_2O_3$, $SnO_2$, ITO ($In_2O_3$—$SnO_2$), ZnO, $TiO_2$, or $Cd_2SnO_4$. Other than this, it may comprise a crystalline semiconductor layer doped with an appropriate impurity with a high concentration.

The collecting electrode 205 (or the grid electrode) serves to effectively collect an electric current generated by virtue of a photoelectromotive force on the transparent and conductive layer 204. The collecting electrode is desired to be in the form of a comb shape.

The collecting electrode may comprise a metal or a metal alloy. Alternatively, the collecting electrode may be formed of an electrically conductive paste.

The power outputting terminals 206*a* and 206*b* serve to output an electromotive force. The outputting terminal 206*a* is electrically connected to the collecting electrode 205 by means of the solder 207.

The outputting terminal 206*b* is electrically connected to the electrically conductive substrate 201 by means of an electrically conductive adhesive (not shown in the figure). Alternatively, the electrical connection in this case may be conducted by spot welding or soldering an appropriate metal body such as a copper tab.

As the solar cell element 101 in the solar cell module shown in FIG. 1 may be a solar cell element comprising a plurality of photovoltaic elements having the above constitution integrated in series connection or in parallel connection depending upon a desired voltage or electric current. It is possible to dispose the integrated cell block on an insulating member such that a desired voltage or electric current can be obtained.

Figure 3:
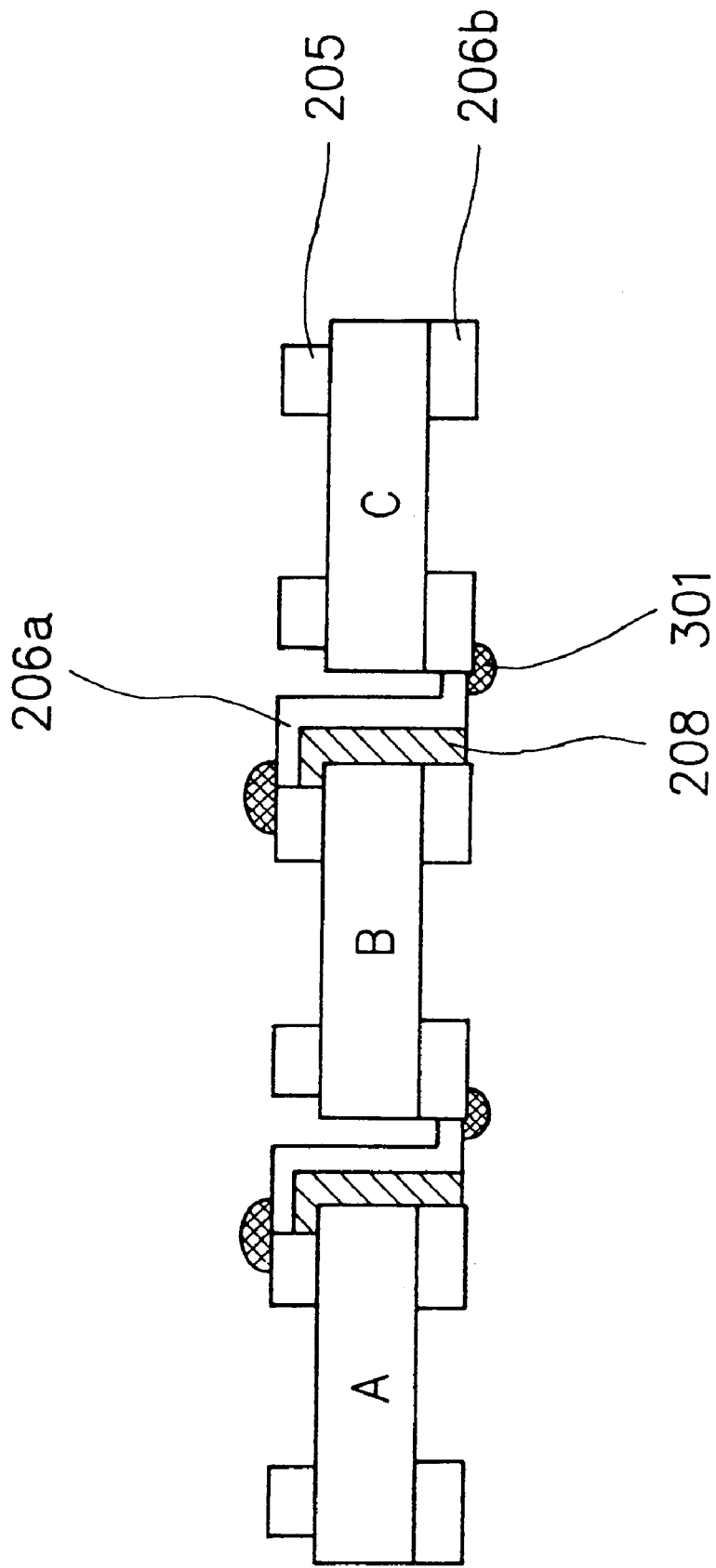
FIG. 3 is a schematic diagram illustrating an example of a solar cell element comprising a plurality of photovoltaic elements integrated in series connection which can be used in the present invention.

FIG. 3 is a schematic diagram illustrating an example of a solar cell element comprising such cell block as described in the above. Particularly, the solar cell element shown in FIG. 3 comprises three photovoltaic elements A, B and C each having the constitution shown FIG. 2 integrated in series connection by electrically connecting the positive side power outputting terminal 206*a* of one photovoltaic element to the negative side power outputting terminal 206*b* of the other photovoltaic element adjacent to the former photovoltaic element by using a solder 301.

Nonwoven Glass Fiber Member

The nonwoven glass fiber member 102 is based on a glass staple fiber with a fiber diameter of 4 μm to 15 μm and a fiber length of 1 mm to 1000 mm or a glass staple fiber with an inorganic compound incorporated therein and having a fiber diameter of 4 μm to 15 μm and a fiber length of 1 mm to 1000 mm, and any of these glass staple fibers has (a) a texture bonded with a binder comprising an organic resin (this hereinafter referred to as nonwoven glass fiber member (a)) or (b) opposite surfaces treated with a silane coupling agent (this hereinafter referred to as nonwoven glass fiber member (b)).

For the nonwoven glass fiber member (a), it is desired to contain the organic resin as the binder in an amount of preferably 2.0 wt. % to 6.0 wt. % or more preferably 3.0 wt. % to 4.5 wt. %. Most desirably, the organic resin for the binder compromises an acrylic resin.

In the case where the content ratio of the organic resin is less than 2.0 wt. %, the basic glass staple fiber cannot be converted into a nonwoven glass fiber member having a texture desirably bonded with the organic resin. In this case, there are other problems in that a desirable nonwoven glass fiber member cannot be efficiently produced, and a nonwoven glass fiber member obtained is liable to entail scuffing when it is handled. On the other hand, in the case where the content ratio of the organic resin is beyond 6.0 wt. %, the organic resin contained in the nonwoven glass fiber member is gradually depolymerized as the duration for the nonwoven glass fiber member to be continuously used is increased, where the number gaps generated upon the depolymerization of the organic resin is gradually increased accordingly.

Acrylic resins are slightly colored with the application of light energy or heat energy. And the use of these acrylic resins as the foregoing binder results in preventing the surface side covering material of the solar cell module from being colored and also in making the surface side covering material to excel in heat resistance and weatherability.

The nonwoven glass fiber member (b) having the opposite surfaces treated with the silane coupling agent has an advantage in that it can be contacted with the surface side filler 103 with an improved adhesion. This situation always prevents the occurrence of the external raising of the nonwoven glass fiber member at the outermost surface of the solar cell module even when the solar cell-module is continuously used over a long period of time.

The silane coupling agent usable in the present invention can include vinyltrichlorosilane, vinyltris(β-methoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

Each nonwoven glass fiber member 102 comprising the above nonwoven glass fiber member (a) or (b) in the solar cell module shown in FIG. 1 is desired to have a thickness of 50 um to 200 um.

Herein, the amount of the surface side filler 103 (which will be later explained) comprising a transparent organic polymer resin is determined in relation to the nonwoven glass fiber member 102. The weight ratio of the organic polymer resin to the entire of the nonwoven glass fiber members in the surface side covering material of the solar cell module is desired to be in the range of from 4 to 12. When there is a single nonwoven glass fiber member in the surface side covering material, the weight ratio of the organic polymer resin to the entire nonwoven glass fiber member in the surface side covering material of the solar cell module is desirably in the range of from 15 to 30.

Now, when the thickness of each nonwoven glass fiber member 102 is less than 50 um, there is a problem in that it is extremely difficult to efficiently produce such nonwoven glass fiber members. In addition, there is also a problem in that it is necessary to stack a number of such thin nonwoven glass fiber members in order to attain a desirable reinforcing effect for the surface side covering material. This situation complicates the process of producing a solar cell module. On the other hand, when the thickness of the nonwoven glass fiber member is beyond 200 um, there are problems such that the acrylic resin contained therein is liable to migrate, resulting in making the nonwoven glass fiber member in an unstable state. Particularly, in the case where the acrylic resin contained in the nonwoven glass fiber member migrates, in a portion of the nonwoven glass fiber member which is rich in the content of the acrylic resin, the acrylic resin in said portion is readily depolymerized during the continuous use of the solar cell module outdoors over a long period of a time to generate gaps having a liability of being influenced by moisture from the outside. Interfacial portions caused by said gaps readily allow external moisture to invade into the solar cell module therethrough, resulting in deteriorating the solar cell element.

Surface Side Filler

The surface side filler 103 serves to cover the irregularities present at the surface of the solar cell element 101 (or the photovoltaic element) in order to prevent the element from being influenced by external factors such as temperature changes or/and humidity changes in the external environment, impacts externally applied, or the like and also in order to attain sufficient adhesion between the element and the surface protective film. Thus, the surface side filler is required to excel in weatherability, adhesion, packing property, heat resistance, cold resistance, impact resistance, and scratch resistance. In addition, the surface side filler is required to have inflammability. In view of this, the surface side filler is desired to be configured such that it comprises a transparent organic polymer resin with the foregoing nonwoven glass fiber embedded by the transparent organic polymer resin, in order to meet said requirements, particularly in order to make the surface side filler have inflammability while attaining sufficient scratch resistance therefor. However, in this case, when the content ratio of the nonwoven glass fiber member to the transparent organic polymer resin is excessive, layer separation may occur between the nonwoven glass fiber and the transparent organic polymer resin resulting in external raising of the nonwoven glass fiber member.

The thinner the thickness of the organic polymer resin is the better, in order to attain sufficient light transmittance so that the solar cell element effectively exhibits a desirable photoelectric conversion efficiency while satisfying the requirement of inflammability. On the other hand, the transparent organic polymer resin is necessary to be properly thickened in order to attain highly reliable sealing which sufficiently encapsulates the irregularities present at the surface of the solar cell element, has sufficient physical strength and causes no external raising of the nonwoven glass fiber member.

The thickness of the transparent organic polymer resin should be properly determined while having due care about the above situation.

However, in general, the thickness of the transparent organic polymer resin is desired to be in the range of from 200 $\mu$m to 800 $\mu$m. In the case where the thickness of the transparent organic polymer resin is less than 200 $\mu$m, it is difficult to allow the nonwoven glass fiber member to incorporate in the transparent organic polymer resin in a desirable state to attain sufficient scratch resistance. When the thickness of the transparent organic polymer resin is beyond 800 $\mu$m, sufficient inflammability cannot be attained.

As previously described, for the amount of the transparent organic polymer resin used as the surface side filler in the solar cell module, it is desired that the weight ratio of the transparent organic polymer resin to the entire of the nonwoven glass fiber members used is in the range of from 4 to 12. When there is a single nonwoven glass fiber member in the surface side covering material, the weight ratio of the organic polymer resin to the entire nonwoven glass fiber member in the surface side covering material of the solar cell module is desirably in the range of from 15 to 30.

When the weight ratio is less than 4, it is difficult to sufficiently embed the nonwoven glass fiber member by the transparent organic polymer resin. On the other hand, when the weight ratio is beyond 12, neither sufficient reinforcing effect nor sufficient scratch resistance can be attained.

Now, in the case where the solar cell module is used under more severe environmental conditions, it is desired to have a marked adhesion between the surface side filler and the photovoltaic element and also between the surface side filler and the surface protective film. In order for the surface side filler to attain such adhesion, it is effective to incorporate an appropriate silane coupling agent or an appropriate organic titanate compound into the transparent organic polymer resin as the surface side filler. For the amount of such silane coupling agent or such organic titanate compound to be incorporated, it is desired to be in the range of from 0.1 part by weight to 3 parts by weight versus 100 parts of the transparent organic polymer resin.

The transparent organic polymer resin usable as the surface side filler can include ethylene-vinyl acetate copolymer (EVA), ethylene-methyl acrylate copolymer (EMA), ethylene-ethyl acrylate copolymer (EEA), polyolefin resins such as butyral resins and the like, urethane resins, and silicone resins. Of these resins, EVA is the most desirable because it exhibits well-balanced physical properties suitable for a solar cell when used as the surface side filler.

Any of the above mentioned resins usable as the surface side filler (this resin will be hereinafter referred to as filler resin) is low in heat deformation temperature and it is liable to readily deform or creep at a high temperature. Because of this, the filler resin is desired to be crosslinked with an appropriate crosslinking agent so that it has an increased heat resistance. As the crosslinking agent, there Man be mentioned organic peroxides.

The crosslinking of the filler resin used as the surface side filler using such organic peroxide as the crosslinking agent is performed by way of pulling hydrogen atoms or halogen atoms in the resin by virtue of free radicals generated from the organic peroxide to form C—C bonds.

In order to make the organic peroxide to generate such free radicals upon crosslinking the filler resin, the organic peroxide is desired to be activated by means of thermal decomposition process, redox decomposition process, or ion decomposition process. Of these processes, the thermal decomposition process is the most appropriate.

The organic peroxide usable as the crosslinking agent can include hydroperoxide, dialkyl (diallyl) peroxide, diacyl peroxide, peroxyketal, peroxyester, peroxycarbonate, and ketone peroxide.

The amount of such organic peroxide as the crosslinking agent added to the filler resin as the surface side filler is desired to be preferably in the range of from 0.5 part by weight to 5 parts by weight versus 100 parts by weight of the filler resin.

The organic peroxide as the crosslinking agent may be used together with the filler resin as the surface side filler upon thermocompression-bonding the filler. Conditions of the temperature and the period of time for the thermocompression-bonding treatment in this case may be properly determined depending upon the thermodecomposition temperature property of the organic peroxide used. However, in general, these conditions are properly determined to be such that 90% or more or preferably, 95% or more of the organic peroxide in the filler resin is thermally decomposed.

The crosslinked degree of the filler resin herein can be examined by observing the gel content of the filler resin. In order to prevent the filler resin from being deformed, it is desired for the filler resin to be crosslinked such that the gel content is preferably 80 wt. % or more or more preferably 90 wt. % or more. A case where the gel content is less than 80 wt. % means that the amount of a non-crystalline portion in the filler resin is likely to result in deteriorating the filler resin.

In order to efficiently crosslink the filler resin, it is desired to use a crosslinking assistant such as triarylcyanurate (TAIC) in addition to the organic-peroxide as the crosslinking agent. In this case, the amount of the crosslinking assistant added is desired to be in the range of from 1 part by weight to 5 parts by weight versus 100 parts by weight of the filler resin.

The surface side filler comprised of the above described filler resin essentially excels in weatherability. However, in order to attain a further improved weatherability for the surface side filler and also in order to effectively protect a layer situated thereunder, it is possible for the surface side filler to contain an appropriate UV absorber. For the amount of the UV absorber added, it is desired to be in the range of from 0.1 part by weight to 0.5 part by weight versus 100 parts by weight of the filler resin. The UV absorber usable in this case can include commercially available chemical compounds usable as an UV absorber such salicylic acid series compounds, benzophenone series compounds, benzotriazole series compounds, and cyanoacrylate series compounds. In a preferred embodiment, it is desired to use an UV absorber having a low volatility in view of the environment for the solar cell module use.

The above described UV absorbers may be used either singly or in combination of two more of them.

Further, in order to improve the resistance to photo-induced degradation of the surface side filler, it is possible for the resin as the surface side filler to contain an appropriate photo stabilizer in addition to the above described UV absorber. Such photo stabilizer can include hindered amine series photo stabilizer. Although the hindered amine series photo stabilizer does not absorb ultraviolet rays as the foregoing UV absorber does, an advantage of further improving the light resistance of the surface side filler is provided by using the hindered amine series photo stabilizer in combination with the UV absorber. The amount of the hindered amine series photo stabilizer added is preferably in the range of from 0.1 part by weight to 0.3 part by weight versus 100 parts by weight of the resin as the surface side filler.

Besides the above described hindered amine series photo stabilizers, there are known other photo stabilizers. But those photo stabilizers are not desirable to use in the present invention because they are mostly colored.

Further in addition, in order to improve the heat resistance of the surface side filler and also in order to improve the processing property of the surface side filler in the thermocompression bonding treatment, it is possible for the surface side filler to contain an appropriate antioxidant. Such antioxidant can include monophenol series antioxidants, bisphenol series antioxidants, high-molecular phenol series antioxidants, sulfur series antioxidants, and phosphorous series antioxidants.

The amount of the antioxidant added is preferably in the range of from 0.1 part by weight to 1 part by weight versus 100 parts by weight of the resin as the surface side filler.

Now, in order to prevent the occurrence of a reduction in the quantity of incident light to reach the solar cell element, the surface side filler is desired to be transparent or substantially transparent. Specifically, it is desired for the surface side filler to have a light transmittance of preferably 80% or more or more preferably 90% or more in a visible light wavelength region of 400 nm to 800 nm. Further in order to facilitate external light to be readily impinged into the solar cell element, the surface side filler is desired to be designed such that it has a refractive index of preferably 1.1 to 2.0 or more preferably 1.1 to 1.6 at a temperature of 25° C.

Surface Protective Film

The surface protective film 104 is positioned at the outermost surface of the solar cell module and because of this, it is required to excel in transparency, water repellency, weatherability, pollution resistance, and physical strength. In addition, in the case where the solar cell module is used under severe environmental conditions outdoors, it is required for the surface protective film to ensure that the solar cell module has sufficient durability upon continuous use over a long period of time.

Therefore, the surface protective film is comprised of an appropriate transparent resin film which satisfies these requirements. Such film can include fluororesin films and acrylic resin films. Of these, the fluororesin films are the most appropriate because they excel especially in weatherability and pollution resistance.

Specific examples of the fluororesin film are polyvinylidene fluoride resin films, polyvinyl fluoride resin films, and tetrafluoroethylene-ethylene copolymer films. Of these fluororesin films, the polyvinylidene fluoride resin films are the most appropriate in terms of weatherability. And the tetrafluoroethylene-ethylene copolymer films are the most appropriate in terms of the weatherability and physical strength in combination.

In order to attain a further improvement in the adhesion of the surface protective film with the surface side filler, a given surface of the surface protective film to be contacted with the surface side filler is desired to be subjected to surface treatment by way of corona discharge treatment, plasma treatment, ozone treatment, UV irradiation treatment, electron beam irradiation treatment, and flame treatment. Particularly, the surface of the surface protective film to be contacted with the surface side filler is desired to be treated by way of such surface treatment so that it has a wettability index of 32 dyne/cm to 45 dyne/cm. In the case where the wettability index is less than 32 dyne/cm, there is such an occasion that the adhesion of the surface protective film with the surface side filler becomes insufficient to cause layer separation at the interface between them.

In the case where the resin film as the surface protective film is an oriented resin film, there is such an occasion that the oriented film is cracked. Therefore, the resin film as the surface protected is desired to comprise a non-oriented resin film. Particularly, the surface protective film is desired to have a tensile elongation rate at brake of 200% to 800% in the lengthwise and crosswise directions in ASTM-D-882 test.

Further, in order to reduce the direct reflection of incident light at the module surface, the surface protective film may be provided with irregularities of 5 um to 50 um in difference of elevation. In this case, there is also an advantage in that the surface protective film is prevented from being broken.

Insulation Film

The insulation film 106 (or the back face protective film) is used for the purpose of electrically isolating the electrically conductive substrate of the solar element 101 from the outside.

The insulation film is desired to be composed of a material capable of sufficiently electrically isolating the electrically conductive substrate of the solar cell element from the outside and which excels in durability, withstands a thermal expansion and thermal contraction, and excels in flexibility. Specific examples of such material are nylon, polyethylene terephthalate (PET), polycarbonate and the like.

Backside Filler

The backside filler 105 serves to ensure the adhesion between the solar cell element 101 and the insulation film 106 (the back face protective film). The backside filler 105 is desired to comprise a material capable of sufficiently ensuring the adhesion between the electrically conductive substrate of the solar cell element 101 and the insulation film 106 and which excels in durability, withstands a thermal expansion and thermal contraction, and excels in flexibility. Specific examples of such material are hot-melt materials such as EVA (ethylene-vinyl acetate copolymer) and polyvinyl butyral, and epoxy adhesives. Other than these, double-coated tapes may be also used.

Separately, the backside filler may be comprise the same material used as the surface side filler.

Back Face Reinforcing Member

As previously described, an appropriate back face reinforcing member may be disposed outside the insulation film 106 in order to improve the physical strength of the solar cell module and also in order to prevent the solar cell module from being distorted or warped due to a change in the environmental temperature. The back face reinforcing member may comprise a steel plate, a plastic plate, or a fiber-glass reinforced plastic plate (or a so-called FRP plate).

Production of Solar Cell Module

In the following, description will be made of the production of a solar cell module according to the present invention using the foregoing solar cell element (or photovoltaic element), filler resin, nonwoven glass fiber member, surface protective resin film, and back face protective material.

Now, in order to enclose a solar cell element (or a photovoltaic element) to produce a solar cell module, it is effective to employ a manner of laminating a surface side covering material on the front face (that is, the light receiving face) of the solar cell element and a back side covering material on the rear face thereof to obtain a stacked body and subjecting the stacked body to thermocompression treatment.

Particularly, a solar cell module according to the present invention which has, for instance, the configuration shown in FIG. 1 may be produced in a manner of laminating a specific nonwoven glass fiber member 102, a given filler resin 103 (shaped in a sheet-like form), a given nonwoven glass fiber member 102, and a given surface protective film 104 in the named order on the side of a light receiving surface of a given solar cell element 101 (or a given photovoltaic element) and laminating a given filler resin 105 (shaped in a sheet-like form) and an insulating film 106 on the rear side of the solar cell element 101 to obtain a stacked body, and subjecting the stacked body to thermocompression treatment while positioning the stacked body such that the surface protective film thereof faces upward, whereby converting the stacked body into a solar cell module.

In the above, the lamination of the back side covering material may be conducted prior to the lamination of the surface side covering material, wherein the insulating film of the stacked body results in facing upward in the thermocompression treatment. However, particularly in order to make it possible to enclose the solar cell element by the filler resin in a small amount, the former manner is desirable.

As shown in FIG. 1, it is possible to dispose a plurality of specific nonwoven glass fiber members 102 on the opposite sides of the filler resin 103 in a state that the nonwoven glass fiber members are contacted with each other. In this case, the efficiency of the stacked body to be deaerated in the thermocompression treatment is further improved to provide a solar cell module which is excellent or satisfactory in combustibility, resistance to scratching, heat resistance and weatherability. Particularly, in this case, the efficiency of the stacked body to be deaerated in the thermocompression treatment is further improved in comparison with the case of using one specific nonwoven glass fiber member, and these nonwoven glass fiber members are made such that they are uniformly present in the stacked body. Hence, the resulting solar cell module becomes such that it excels particularly in resistance to scratching.

In the case where a reinforcing member (a back face reinforcing member) is intended, it may be laminated with the use of an appropriate adhesive. This may be conducted in the lamination process for obtaining the stacked body or after the thermocompression treatment.

As for conditions of a temperature to which the stacked body is heated and the period of time during which the stacked body is heated at said temperature in the thermocompression treatment, they should be properly determined so that the resin involved is sufficiently crosslinked.

The thermocompression treatment of the stacked body may be conducted by using a conventional single chambered vacuum laminater, double chambered vacuum laminater or roll laminater. Of these, the thermocompression treatment by means of the single chambered vacuum laminater is the most advantageous, because it enables production of a solar cell module according to the present invention in a simple manner and at a reasonable production cost.

In the following, the present invention will be described in more detail with reference to examples which are not intended to restrict the scope of the present invention.

EXAMPLE 1

Figure 4:
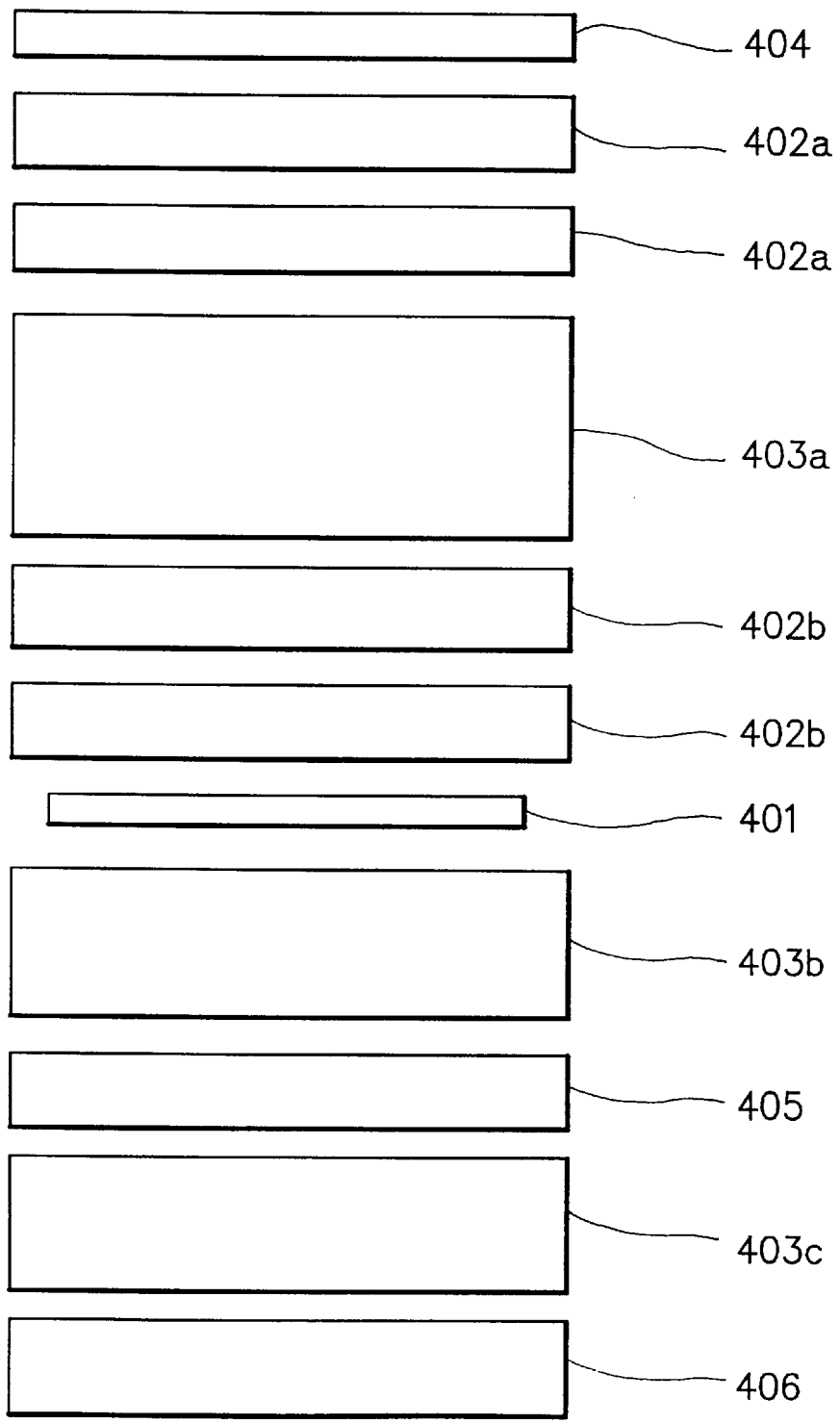
FIG. 4 is a schematic view illustrating the constitution of another example of a solar cell module according to the present invention.

In this example, a solar cell module having the configuration shown in FIG. 4 was prepared in the following manner.

1. Preparation of Solar Cell Element 401:

As the solar cell element 401, there was prepared an amorphous silicon solar cell element comprising three photovoltaic elements having the constitution shown in FIG. 2 integrated in series connection as shown in FIG. 3.

The amorphous silicon solar cell element was prepared in the following manner.

(1) Preparation of Three Photovoltaic Elements:

Each photovoltaic element was prepared in the following manner.

There was provided a well-cleaned stainless steel plate as the substrate 201. On the substrate 201, there was formed a two-layered back reflecting layer 202 comprising a 5000 Å thick Al film and a 5000 Å thick ZnO film by means of the conventional sputtering process, followed by forming, on the back reflecting layer 202, a tandem type amorphous silicon photoelectric conversion semiconductor layer 203 with a nip/nip structure comprising a 150 Å thick n-type layer/a 4000 Å thick i-type layer/a 100 Å thick p-type layer/a 100 Å thick n-type layer/a 800 Å thick i-type layer/a 100 Å thick p-type layer being laminated in the named order from the substrate side by means of the conventional plasma CVD manner, wherein an n-type amorphous silicon film as each n-type layer was formed from a mixture of $SiH_4$ gas, $PH_3$ gas and $H_2$ gas; an i-type amorphous silicon film as each i-type layer was formed from a mixture of $SiH_4$ gas and $H_2$ gas; and a p-type microcrystalline silicon film as each p-type layer was formed from a mixture of $SiH_4$ gas, $BF_3$ gas and $H_2$ gas. Then, on the semiconductor layer 203, there was formed a 700 Å thick transparent and conductive layer 204 composed of $In_2O_3$ by means of the conventional heat resistance evaporation process wherein an In-source was evaporated in an $O_2$ atmosphere. Thus, there was obtained a photovoltaic element.

Successively, a grid electrode as a collecting electrode 205 was formed on the transparent and conductive layer 204 by subjecting an Ag-paste to screen printing.

Then, a copper tub as a negative side power outputting terminal 206b was fixed to the substrate 201 using a stainless solder. And a tin foil tape as a positive side power outputting terminal 206a was fixed to the grid electrode as the collecting electrode 205 using a solder 207. In this case, an insulating tape 208 was previously was previously provided as shown in FIG. 2 in order to attain electrical isolation for the tin foil tape 206. Thus, there was obtained a photovoltaic element. In this way, there were obtained three photovoltaic elements.

(2) Preparation of a Solar Cell Element:

Using the three photovoltaic elements obtained in the above step (1), there was prepared a solar-cell element having the constitution shown in FIG. 3. The three photovoltaic elements A, B and C are linearly arranged, and they were integrated in series connection by electrically connecting the positive side power outputting terminal 206a of one photovoltaic element to the negative side power outputting terminal 206b of the other photovoltaic element adjacent to the former photovoltaic element by using a solder 301.

Thus, there was obtained a solar cell element as the solar cell element 401.

2. Preparation of Solar Cell Module:

Using the solar cell element obtained in the above step 1, there was prepared a solar cell module having the configuration shown in FIG. 4 in the following manner.

(1) Provision of Nonwoven Glass Fiber Member:

As the nonwoven glass fiber members 402a, 402a, 402b and 402b, there were provided four 100 μm thick nonwoven glass fiber members having a texture bonded with a binder comprising an acrylic resin, each comprising a GLASPER GMC-00-020(B) (trademark name, produced by Honshu Seishi Kabushiki Kaisha; acrylic resin content: 4.0 wt. %; packing density: 20 g/m$^2$).

(2) Provision of Filler Resin:

The filler resin functions as a sealer for the solar cell element.

As the filler resins 403a, 403b, and 403c, there were provided three 460 μm thick EVA sheets each comprising a PHOTOCAP A9918P/200rsm/936 (trademark name, produced by Springborn Laboratories Company). Each of the EVA sheets herein is composed of a resin composition comprising 100 parts by weight of an EVA (ethylene-vinyl acetate copolymer, vinyl acetate content: 33 wt. %), 1.5 part by weight of a crosslinking agent, 0.3 part by weight of an UV absorber, 0.1 part by weight of a photo stabilizer, 0.2 part by weight of an antioxidant, and 1.0 part by weight of a silane coupling agent.

(3) Provision of Surface Protective Film:

As the surface protective film 404, there was provided a 50 μm thick non-oriented ETFE (ethylene-tetrafluoroetylene copolymer) film comprising a NON-ORIENTED TEFZEL FILM (trademark name, produced by Du Pont Company).

(4) Provision of Insulating Film:

As the insulating film 405, there was provided a 63.5 μm thick nylon film comprising a DARTEK (trademark name, produced by Du Pont Company).

(5) Provision of Reinforcing Member:

As the reinforcing member 406, there was provided a black-colored galvanized steel plate (Zn-Al plated steel plate) having a thickness of 0.27 mm.

(6) Preparation of a Solar Cell Module:

In the preparation of a solar cell module, there was used a conventional single chambered vacuum laminater comprising a mounting table on which an object to be treated is to be mounted and a silicone rubber covering member which serves to enclose the object on the mounting table, the mounting table being provided with an O-ring serving to seal between the silicone rubber covering member and the mounting table and an exhaust system connected to a vacuum pump.

Now, there were stacked the galvanized steel plate 406, the EVA sheet 403c, the insulating film 405, the EVA sheet 403b, the solar cell element 401, the nonwoven glass fiber member 402b, the nonwoven glass fiber member 402b, the EVA sheet 403a, the nonwoven glass fiber member 402a, the nonwoven glass fiber member 402a, and the ETFE film 404 in the named order on the mounting table of the laminater to form a stacked body on the mounting table. The silicone rubber covering member was superposed on the stacked body so as to enclose the stacked body while sealing between the mounting table and the silicone rubber covering member by means of the O-ring (the resultant herein will be hereinafter referred to as lamination instrument). Then, the vacuum pump of the laminater was operated to evacuate the space containing the stacked body between the mounting table and the silicone rubber covering member to a predetermined vacuum degree. Thereafter, while continuing the vacuuming operation by the vacuum pump, the lamination instrument was introduced into an oven. The inside of the oven was previously maintained at 150° C. prior to the introduction of the lamination instrument therein. The stacked body in the lamination instrument was subjected to heat treatment for 30 minutes. After the heat treatment of the stacked body in the lamination instrument in the oven, while continuing the vacuuming operation by the vacuum pump, the lamination instrument was taken out from the oven, followed by air-cooling to about room temperature. Then, the operation of the vacuum pump was terminated. Thereafter, the silicone rubber covering member was removed, and the stacked body was taken out from the lamination instrument. Thus, there was obtained a solar cell module.

In this way, there were prepared a plurality of solar cell modules.

Evaluation

Using the resultant solar cell modules, evaluation was conducted with respect to (1) initial exterior appearance, (2) resistance to scratching, (3) inflammability, (4) endurance against environmental atmosphere with high temperature and high humidity, (5) weatherability, (6) light resistance, and (7) heat resistance.

The evaluated results obtained are collectively shown in Table 2.

The evaluation of each of the above evaluation items was conducted in the following manner.

(1) Evaluation of the Initial Exterior Appearance:

The solar cell module was optically observed. The observed result is shown in Table 2 based on the following criteria:

○: a case where no defect is observed in the exterior appearance;

Δ: a case where a slight defect is observed in the exterior appearance but it is not problematic in practice; and X: a case where distinguishable defects such as curvature and the like are observed in the exterior appearance.

Figure 5:
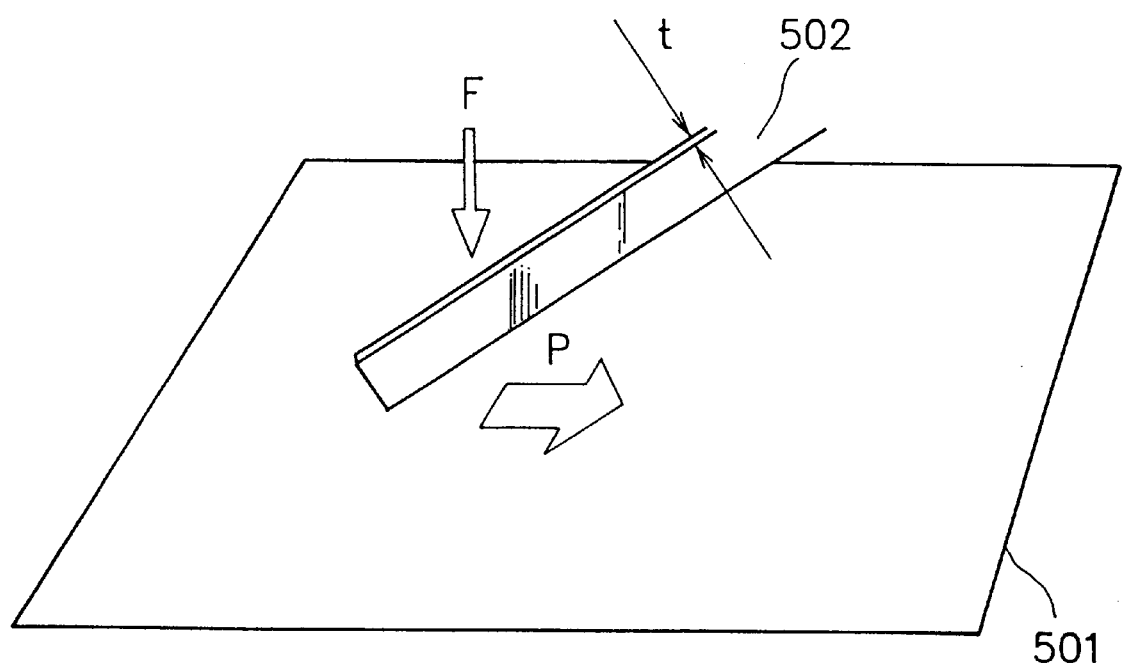
FIG. 5 is a schematic view for explaining scratch resistance test which will be later described.

(2) Evaluation of the Resistance to Scratching:

This evaluation was conducted in the following manner. The solar cell module was subjected to surface treatment in a manner shown in FIG. 5, wherein a metal plate 502 having a thickness t of 1 mm is contacted through a corner thereof to the most unevened portion of the light receiving surface side 501 of the solar cell module. Then, to the metal plate, a load F of 2 pounds is applied and separately, a load F of 5 pounds is applied without moving the metal plate. And in each case, the metal plate is pulled in a direction indicated by an arrow P while applying the load F thereto to form a scratch. Then the solar cell module thus treated is evaluated of whether or not its scratched portion of the surface covering material is still insulative in electrically isolating from the outside. This evaluation is conducted by immersing the treated solar cell module in an electrolytic solution of 3000 Ω.cm, and applying a voltage of 2200 V between the photovoltaic element of the solar cell module and the electrolytic solution to observe a leakage current.

The evaluated result is shown in Table 2 based on the following criteria.

○: a case (acceptable) where the leakage current is 50 μA or less for the load F of 5 pounds applied;

Δ: a case (acceptable) where the leakage current is 50 μA or less for the load F of 2 pounds applied; and X: a case (unacceptable) where the leakage current is beyond 50 μA for the load F of 2 pounds applied.

(3) Evaluation of the Inflammability:

The solar cell module was placed on a deck slanted at 22° against the horizon. And a gas burner flame of 760±28° C. was supplied to the surface-covering material side of the solar- cell module for 10 minutes, wherein the flame spreading was observed. The observed result is shown in Table 2 based on the following criteria:

○: a case (acceptable) where the flame spreading is less than a distance of 6 feet from the tip; and X: a case (unacceptable) where the flame spreading is beyond a distance of 6 feet from the tip.

(4) Evaluation of the Endurance Against Environmental Atmosphere with High Temperature and High Humidity:

The solar cell module was exposed to atmosphere with 85° C./85%RH for 200 hours. Thereafter, its exterior appearance was optically observed. The observed result is shown in Table 2 based on the following criteria:

○: a case where no change is observed in the exterior appearance;

Δ: a case where a slight change is observed in the exterior appearance but it is not problematic in practice; and X: a case where problematic, distinguishable removal or/and crack, and coloring which are not acceptable in practice are observed in the exterior appearance.

(5) Evaluation of the Weatherability:

The solar cell module was placed in a carbon-arc sunshine weather meter, wherein it was irradiated with pseudo sunlight for 5000 hours and for 10000 hours, respectively under conditions of alternately repeating a cycle of maintaining at a black panel temperature of 63° C. for 108 minutes and a cycle of pure water fall for 12 minutes. Thereafter, its exterior appearance in the case of each of the irradiation period of 5000 hours and the irradiation period of 10000 hours was optically observed. The observed results are shown in Table 2 based on the following criteria:

○: a case where no change is observed in the exterior appearance;

Δ: a case where a slight change is observed in the exterior appearance but it is not problematic in practice; and X: a case where problematic, distinguishable removal or/and crack, and coloring which are not acceptable in practice are observed in the exterior appearance.

(6) Evaluation of the Light Resistance:

The solar cell module was placed in an ultraenergy irradiation tester (produced by Suga Shikenki Kabushiki Kaisha). In the tester, the solar cell module was subjected to dew cycle test in that a cycle of exposing to irradiation of UV rays having an intensity of 100 mW/cm² (300 nm to 400 nm) from a metal halide lamp under conditions of 70° C. and 70%RH for a black panel for 5 hours and a cycle of exposing to a dew condensation atmosphere with 30° C. and 96%RH for an hour were alternately repeated for 2000 hours. Thereafter, its exterior appearance was optically observed. The observed result is shown in Table 2 based on the following criteria:

○: a case where no change is observed in the exterior appearance;

Δ: a case where a slight change is observed in the exterior appearance but it is not problematic in practice; and X: a case where problematic, distinguishable removal or/and crack, and coloring which are not acceptable in practice are observed in the exterior appearance.

(7) Evaluation of the Heat Resistance:

The solar cell module was exposed to an atmosphere with 90° C. for 3000 hours. Thereafter, its exterior appearance was optically observed. The observed result is shown in Table 2 based on the following criteria:

○: a case where no change is observed in the exterior appearance;

Δ: a case where a slight change is observed in the exterior appearance but it is not problematic in practice; and X: a case where problematic, distinguishable removal or/and crack, and coloring which are not acceptable in practice are observed in the exterior appearance.

EXAMPLE 2

The procedures of Example 1 were repeated, except that the two nonwoven glass fiber members 402a were not used, to thereby obtain a plurality of solar cell modules.

Using the resultant solar cell modules, evaluation was conducted in the same evaluation manner as in Example 1.

The evaluated results obtained are collectively shown in Table 2.

EXAMPLE 3

The procedures of Example 1 were repeated, except that the thickness of the EVA sheet 403a was changed to 600 μm, to thereby obtain a plurality of solar cell modules.

Using the resultant solar cell modules, evaluation was conducted in the same evaluation manner as in Example 1.

The evaluated results obtained are collectively shown in Table 2.

EXAMPLE 4

The procedures of Example 1 were repeated, except that the two nonwoven glass fiber members 402a were replaced by three nonwoven glass fiber members 402a, the two nonwoven glass fiber members 402b were replaced by three nonwoven glass fiber members 402b, and the thickness of the EVA sheet 403a was changed to 600 um, to thereby obtain a plurality of solar cell modules.

Using the resultant solar cell modules, evaluation was conducted in the same evaluation manner as in Example 1.

The evaluated results obtained are collectively shown in Table 2.

EXAMPLE 5

The procedures of Example 1 were repeated, except that the insulating film 405 was replaced by a PET (polyethylene terephthalate) film having a thickness of 50 μm, to thereby obtain a plurality of solar cell modules.

Using the resultant solar cell modules, evaluation was conducted in the same evaluation manner as in Example 1.

The evaluated results obtained are collectively shown in Table 2.

EXAMPLE 6

The procedures of Example 1 were repeated, except that the two nonwoven glass fiber members 402a were not used and the two nonwoven glass fiber members 402b were replaced by a nonwoven glass fiber member having a thickness of 400 μm (trademark name: GLASPER GMC-00-080(B) produced by Honshu Seishi Kabushiki Kaisha, packing density: 80 g/m²), to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 1

The procedures of Example 1 were repeated, except that each of the nonwoven glass fiber members 402a and 402b was replaced by a nonwoven glass fiber member in which vinyl alcohol is used a binder, to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 2

The procedures of Example 1 were repeated, except that each of the nonwoven glass fiber members 402a and 402b was replaced by a nonwoven glass fiber member of 5 g/m² in packing density and having a thickness of 25 μm, to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 3

The procedures of Example 1 were repeated, except that each of the nonwoven glass fiber members 402a and 402b was replaced by a nonwoven glass fiber member having a thickness of 400 μm (trademark name: GLASSPER GMC-00-080(B) produced by Honshu Seishi Kabushiki Kaisha, packing density: 80 g/m²), to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 4

The procedures of Example 1 were repeated, except that the binder content of each of the nonwoven glass fiber members 402a and 402b was changed to 15 wt. %, to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 5

The procedures of Example 1 were repeated, except that the non-oriented ETFE film as the surface protective film 404 was replaced by an oriented ETFE film having a thickness of 38 μm, to thereby obtain a plurality of solar cell modules.

Using the resultant solar cell modules, evaluation was conducted in the same evaluation manner as in Example 1.

The evaluated results obtained are collectively shown in Table 2.

COMPARATIVE EXAMPLE 6

The procedures of Example 1 were repeated, except that the thickness of each of the EVA sheets 403a, 403b and 403c was changed to 1000 μm, to thereby obtain a plurality of solar cell modules.

Using the resultant solar cell modules, evaluation was conducted in the same evaluation manner as in Example 1.

The evaluated results obtained are collectively shown in Table 2.

Total Evaluation

Based on the results shown in Table 2, the following are understood.

Any of the solar cell modules obtained in Examples 1 to 6 belonging to the present invention is excellent or satisfactory in initial exterior appearance, scratch resistance, inflammability, weatherability, light resistance, heat resistance. In addition, any of these solar cell modules maintains its initial exterior appearance without the occurrence of problematic layer separation or external raising of the nonwoven glass fiber member not only in the high temperature and high humidity test but also in the weatherability test for 10000 hours. Hence, it is understood that any of these solar cell modules is highly reliable even upon repeated use over a long period of time.

On the other hand, it is understood that any of the solar cell modules obtained in Comparative Examples 1 to 6 is apparently inferior to the solar cell modules of the present invention.

Particularly, for the solar cell module of Comparative Example 1, it is understood that the solar cell module is inferior in weatherability and heat resistance. Particularly, the solar cell module was found to entail a problem of yellowing the surface side covering material in the heat resistance test. This results in reducing the photoelectric conversion efficiency of the solar cell module.

For the solar cell module of Comparative Example 2, it is understood that the solar cell module is inferior in scratch resistance. In addition, the solar cell module was found to entail a problem of somewhat later separation at the surface protective film in the weatherability test and the light resistance test.

For the solar cell module of Comparative Example 3, it is understood that the solar cell module is inferior in initial exterior appearance, endurance against environmental atmosphere with high temperature and high humidity, weatherability, light resistance and heat resistance. In addition, the solar cell module was found to entail a problem of allowing moisture invasion thereinto to deteriorate the sealing resin. Hence, the solar cell module is inferior in reliability.

For the solar cell module of Comparative Example 4, it is understood that the solar cell module is inferior in endurance against environmental atmosphere with high temperature and high humidity, weatherability, light resistance and heat resistance. Particularly, the solar cell module was found to entail a problem of yellowing the surface side covering material in the high temperature and high humidity test, the weatherability test, light resistance test, and the heat resistance test. This results in reducing the photoelectric conversion efficiency of the solar cell module.

The solar cell module of Comparative Example 5 was found to have a crack in the initial exterior which is liable to entail a problem of allowing moisture invasion into the solar cell module. In addition, the solar cell module was found to have a problem of the occurrence of remarkable external raising of the nonwoven glass fiber member in the weatherability test for 10000 hours.

For the solar cell module of Comparative Example 6, it is understood that the solar cell module is inferior in inflammability and in heat resistance although it is satisfactory in the initial exterior appearance. Particularly, the solar cell module was found to entail a problem of yellowing the surface side covering material in the heat resistance test.

EXAMPLE 7

In this example, a solar cell module having the configuration shown in FIG. 4 in which a nonwoven glass fiber member having opposite surfaces treated with a silane coupling agent is used and having an uneven surface was prepared in the following manner.

As the solar cell element 401, there was provided a solar cell element prepared in accordance with the procedures for the preparation of a solar cell element in Example 1.

On the light receiving face of the solar cell element 401, an acrylsilicon series thermosetting coating (trademark name: FINEHARD produced by Tohnen Kabushiki Kaisha) was applied by means of spray coating process to a coat, followed by drying at 200° C. for 30 minutes. By this, a resin coat was formed to cover the light receiving face of the solar cell element 401.

As the nonwoven glass fiber member 402b, there was provided a nonwoven glass fiber member having opposite surfaces treated with a silane coupling agent obtained by applying an ethanol solution containing 0.5 wt. % of γ-methacryloxypropyl trimethoxy silane (commercial identification: SZ6030, produced by Toray Dow Corning Silicone Kabushiki Kaisha) onto opposite surfaces of a nonwoven glass fiber member CRANE GLASS 230 (produced by Crane Company) and drying the resultant.

As the filler resins 403a, 403b, and 403c, there were provided three 460 μm thick EVA sheets each comprising a PHOTOCAP series EVA sheet (produced by Springborn Laboratories Company). Each of the EVA sheets herein is composed of a resin composition comprising 100 parts by weight of an EVA (ethylene-vinyl acetate copolymer, vinyl acetate content: 33 wt. %), 1.5 parts by weight of a crosslinking agent, 0.3 part by weight of an UV absorber, 0.1 part by weight of a photo stabilizer, 0.2 part by weight of an antioxidant, and 0.25 part by weight of a silane coupling agent.

As the surface protective film 404, there was provided a 50 μm thick ETFE film comprising a TEZEL FILM (trademark name, produced by Du Pont Company) having a corona-treated surface to be contacted with the EVA sheet.

As the insulating film 405, there was provided a 63.5 μm thick nylon film comprising a DARTEC (trademark name, produced by Du Pont Company).

As the reinforcing member 406, there was provided a 0.27 mm thick galvanized steel member comprising a TIMA- RCOLOR (trademark name, produced by Daido Kohan Kabushiki Kaisha).

As a member for the formation of an uneven surface, there was provided a stainless steel mesh member of 40×40 in mesh size and 0.15 mm in linear diameter.

The preparation of the foregoing solar cell module was conducted using the same single chambered vacuum m laminater used in Example 1.

There were stacked the galvanized steel member 406, the EVA sheet 403c, the nylon film 405, the EVA sheet 403b, the solar cell element 401 having the resin coat on the light receiving face, the nonwoven glass fiber member 402b having the silane coupling agent-treated opposite surfaces, the EVA sheet 403a, and the ETFE film 404 in the named order on the mounting table of the laminater to form a laminate on the mounting table. On the surface of the surface protective film 404 of the laminate on the mounting table, a release member comprising a Teflon film (trademark name: TEFLON PFA FILM produced by Du Pont Company) was laminated, followed by laminating the stainless steel mesh member on the release member, whereby forming a stacked body situated on the mounting table. Then, the silicone rubber covering member was superposed on the stacked body so as to enclose the stacked body while sealing between the mounting table and the silicone rubber Uncovering member by means of the O-ring (the resultant herein will be hereinafter referred to as lamination instrument). Successively the vacuum pump of the laminater was operated to evacuate the space containing the stacked body between the mounting table and the silicone rubber covering member to a predetermined vacuum degree. Thereafter, while continuing the vacuuming operation by the vacuum pump, the lamination instrument was introduced into an oven. The inside of the oven was previously maintained at 150° C. prior to the introduction of the lamination instrument therein. The stacked body in the lamination instrument was subjected to heat treatment at 150° C. for 30 minutes. After the heat treatment of the stacked body in the lamination instrument in the oven, while continuing the vacuuming operation by the vacuum pump, the lamination instrument was taken out from the oven, followed by air-cooling to about room temperature. Then, the operation of the vacuum pump was terminated. Thereafter, the silicone rubber covering member was removed, and the stacked body was taken out from the lamination instrument. Then, the release member and the stainless steel mesh member of the stacked body were removed. Thus, there was obtained a solar cell module having an uneven surface provided with a number of minute irregularities of 30 μm in maximum difference of elevation.

In the above, the pair of power outputting terminals were previously extended to the rear side of the solar cell element so that they could be wired to the outside through wiring holes previously provided at the galvanized steel member of the stacked body after completion of the lamination treatment.

Evaluation

The resultant solar cell module was evaluated with respect to changes in electrical insulation resistance for the surface side covering material when immersed in water over a long period of time. This evaluation was conducted in the following manner. That is, the surface side of the solar cell module was immersed in service water for a predetermined period of time. Then, a metal plate was superposed on the entire surface of the solar cell module, and a D.C. voltage of 2200 V was impressed between the metal plate and a portion of the solar cell module where the positive and negative terminal sides were short-circuited, where an electric current flow was measured. Based on the measured electric current, an electric resistance value per a unit area of the surface side covering material was obtained. In this way, an electric resistance value per a unit area of the surface side covering material for each predetermined water immersion time was evaluated. The evaluated results are graphically shown in FIG. 6.

EXAMPLE 8

The procedures of Example 7 were repeated, except that the glass fiber member was replaced by a nonwoven glass fiber member comprising a GLASPER (trademark name, produced by Honshu Denki Kabushiki Kaisha) having opposite surfaces treated with a silane coupling agent comprising amino silane, to thereby obtain a solar cell module.

The resultant solar cell module was evaluated in the same evaluation manner as in Example 7.

Figure 6:
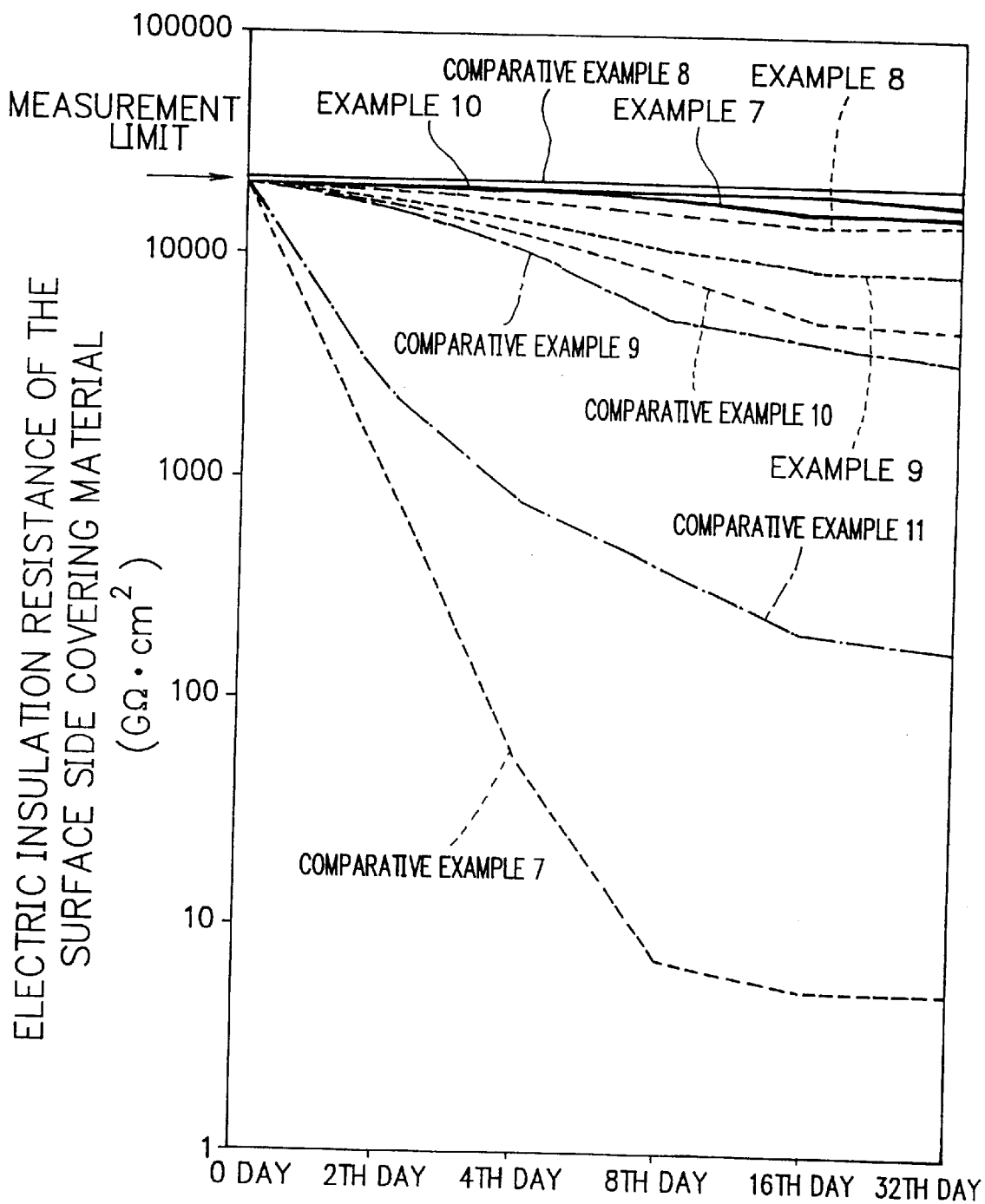
FIG. 6 is a graph showing the examined electric insulation resistances of the surface side covering materials of solar cell modules obtained in examples and comparative examples which will be later described.

The evaluated results are graphically shown in FIG. 6.

EXAMPLE 9

The procedures of Example 7 were repeated, except that the stainless steel mesh member was replaced by a stainless steel mesh member of 16×16 in mesh size and 0.27 mm in linear diameter, to thereby obtain a solar cell module having an uneven surface provided with a number of minute irregularities of 160 μm in maximum difference of elevation.

The resultant solar cell module was evaluated in the same evaluation manner as in Example 7.

The evaluated results are graphically shown in FIG. 6.

EXAMPLE 10

The procedures of Example 7 were repeated, except that as the surface protective film 404, a 125 μm thick acrylic resin film comprising a ACRYPLEN (trademark name, produced by Mitsubishi Rayon Kabushiki Kaisha) was used, to thereby obtain a solar cell module.

The resultant solar cell module was evaluated in the same evaluation manner as in Example 7.

The evaluated results are graphically shown in FIG. 6.

COMPARATIVE EXAMPLE 7

The procedures of Example 7 were repeated, except that the treatment with the silane coupling agent was not conducted for the nonwoven glass fiber member, to thereby obtain a solar cell module.

The resultant solar cell module was evaluated in the same evaluation manner as in Example 7.

The evaluated results are graphically shown in FIG. 6.

COMPARATIVE EXAMPLE 8

The procedures of Example 7 were repeated, except that no nonwoven glass fiber member was used, to thereby obtain a solar cell module.

The resultant solar cell module was evaluated in the same evaluation manner as in Example 7.

The evaluated results are graphically shown in FIG. 6.

COMPARATIVE EXAMPLE 9

The procedures of Example 7 were repeated, except that no resin coat was formed on the light receiving surface of the solar cell element, to thereby obtain a solar cell module.

The resultant solar cell module was evaluated in the same evaluation manner as in Example 7.

The evaluated results are graphically shown in FIG. 6.

COMPARATIVE EXAMPLE 10

The procedures of Example 7 were repeated, except that as the surface protective film 404, a 38 μm thick oriented ETFE film comprising a TEFZEL T2 FILM (trademark name, produced by Du Pont Company), to thereby obtain a solar cell module.

The resultant solar cell module was evaluated in the same evaluation manner as in Example 7.

The evaluated results are graphically shown in FIG. 6.

COMPARATIVE EXAMPLE 11

The procedures of Example 7 were repeated, except that the silane coupling agent of each of the EVA sheets 403a, 403b and 403c was omitted, to thereby obtain a solar cell module.

The resultant solar cell module was evaluated in the same evaluation manner as in Example 7.

The evaluated results are graphically shown in FIG. 6.

Total Evaluation

Based on the results shown FIG. 6, the following are understood.

Any of the solar cell modules obtained in Examples 7 to 10 belonging to the present invention surpass the solar cell modules obtained in Comparative Examples 7, 9, 10, and 11 in terms of the reduction in the electrical insulation resistance.

For the solar cell module obtained in Comparative Example 8, no reduction occurred in the electric insulation resistance because no water invasion pathway was caused due to a fact that no nonwoven glass fiber member was used. However, the solar cell module was found to entail a problem of causing damage extending to the solar cell element in the foregoing test for the resistance to scratching described in Example 1. Hence, it is understood that the surface side covering material of the solar cell module does not endure against severe outdoor environment.

As above described, according to the present invention, there is stably provided a highly reliable solar cell module which sufficiently satisfies the requirements relating to resistance to scratching and combustibility which could not be sufficiently satisfied in the prior art, which excels in heat resistance, weatherability and light resistance, and which always excels in the exterior appearance without external raising of the nonwoven glass fiber member even upon continuous use in outdoors over a long period of time.

Further, the solar cell module according to the present invention is free of a reduction in the electric insulation resistance even when immersed in water containing an electrolyte over a long period of time, and it is free of the occurrence of a reduction in the photoelectric conversion performance and of the occurrence of electric shock even upon continuous use in outdoors over a long period of time. Hence, the solar cell module is highly reliable.

TABLE 1

|  | initial electric insulation resistance before the water immersion (MΩ) | electric insulation resistance after the water immersion for 2 days (MΩ) | electric insulation resistance after the water immersion for 4 days (MΩ) | electric insulation resistance after the water immersion for 8 days (MΩ) | electric insulation resistance after the water immersion for 16 days (MΩ) | electric insulation resistance after the water immersion for 32 days (MΩ) |
|---|---|---|---|---|---|---|
| conventional solar cell module with nonwoven glass fiber member | >6000 | 300 | 15 | 2 | 1.5 | 1.5 |
| conventional solar cell module with no nonwoven glass fiber member | >6000 | >6000 | >6000 | >6000 | 5500 | 5500 | note:
6000 M is measurement limit

TABLE 2

|  | initial exterior appearance | scratch resistance | combustibility | endurance against environmental atmosphere with high temperature and high humidity | weatherability 5000 hrs. | weatherability 10000 hrs | light resistance | heat resistance |
|---|---|---|---|---|---|---|---|---|
| Example 1 | ○ | ○ | ○ | ○ | ○ | ○ | ○ | ○ |
| Example 2 | ○ | Δ | ○ | ○ | ○ | ○ | ○ | ○ |
| Example 3 | ○ | ○ | ○ | ○ | ○ | ○ | ○ | ○ |
| Example 4 | ○ | ○ | ○ | ○ | ○ | ○ | ○ | ○ |
| Example 5 | ○ | ○ | ○ | ○ | ○ | ○ | ○ | ○ |

TABLE 2-continued

| | initial exterior appearance | scratch resistance | combustibility | endurance against environmental atmosphere with high temperature and high humidity | weatherability 5000 hrs. | weatherability 10000 hrs | light resistance | heat resistance |
|---|---|---|---|---|---|---|---|---|
| Example 6 | ○ | ○ | ○ | ○ | ○ | Δ | Δ | ○ |
| Comparative Example 1 | ○ | ○ | ○ | Δ | Δ | x | Δ | x |
| Comparative Example 2 | ○ | x | ○ | Δ | ○ | Δ | Δ | ○ |
| Comparative Example 3 | x | ○ | ○ | x | x | x | x | x |
| Comparative Example 4 | ○ | ○ | ○ | x | Δ | x | x | x |
| Comparative Example 5 | Δ | ○ | ○ | Δ | Δ | x | Δ | Δ |
| Comparative Example 6 | ○ | ○ | x | ○ | ○ | Δ | ○ | x |

What is claimed is:

1. A solar cell module comprising a solar cell element and at least a surface side covering material positioned on the light receiving face side of said solar cell element, said surface side covering material comprising at least a filler, a nonwoven glass fiber member, and a surface protective film, wherein said nonwoven glass fiber member has a thickness of 50 $\mu$m to 200 $\mu$m and a texture bonded with an acrylic resin.

2. A solar cell module according to claim 1, wherein the nonwoven glass fiber member comprises a plurality of nonwoven glass fiber members.

3. A solar cell module according to claim 2, wherein the plurality of nonwoven glass fiber members are contacted with each other.

4. A solar cell module according to claim 2, wherein a weight ratio of the filler to the plurality of nonwoven glass fiber members is in a range of 4 to 12.

5. A solar cell module according to claim 2, wherein the acrylic resin contained in the nonwoven glass fiber member is of a content in a range of 2.0 wt. % to 6.0 wt. %.

6. A solar cell module according to claim 1, wherein a weight ratio of the filler to the nonwoven glass fiber member is in a range of 15 to 30.

7. A solar cell module according to claim 1, wherein the filler contains a silane coupling agent.

8. A solar cell module according to claim 1, wherein the filler comprises a resin selected from a group consisting of polyolefinic resins, urethane resins, and silicone resins.

9. A solar cell module according to claim 1, wherein the surface protective film is composed of a resin selected from a group consisting of fluororesins and acrylic resins.

10. A solar cell module according to claim 1, wherein the surface protective film comprises a non-oriented resin film.

11. A solar cell module according to claim 1, wherein the surface protective film has a face contacted with the filler, said face having a wettability index of 32 to 45 dyne/cm.

12. A solar cell module according to claim 1, wherein the surface protective film is of 200 to 800% in tensile elongation rate at break.

13. A solar cell module according to claim 1, wherein the surface protective film has an uneven surface provided with a plurality of irregularities of 5 to 50 $\mu$m in difference of elevation.

14. A solar cell module according to claim 1 which further comprises a reinforcing member disposed on a rear face side of the solar cell element.

15. A solar cell module according to claim 14 which further comprises an insulating film interposed between the solar cell element and the reinforcing member.

16. A solar cell module according to claim 15, wherein the insulating member comprises a film of nylon, polyethylene terephthalate, or polycarbonate.

17. A solar cell module according to claim 14, wherein the reinforcing member comprises a member selected from a group consisting of steel members, plastic members and glass fiber reinforced plastic members.

18. A solar cell module according to claim 1, wherein the solar cell element is an amorphous silicon solar cell element.

19. A solar cell module according to claim 1, wherein the nonwoven glass fiber member is applied with a silane coupling treatment.

20. A process for producing a solar cell module, said process including the steps of:

(a) laminating an insulating film, a back side filler member, a solar cell element, a nonwoven glass fiber member having a thickness of 50 $\mu$m to 200 $\mu$m and a texture bonded with an acrylic resin, a surface side filler member, and a surface protective film in this order to obtain a stacked body, and (b) subjecting said stacked body to thermocompression treatment to obtain said solar cell module.

21. The process according to claim 20, wherein in the step (a), a nonwoven glass fiber member is interposed between the surface side filler member and the surface protective film.

22. The process according to claim 20, wherein the step (a), a reinforcing member is laminated to an outer surface of the insulating film of the stacked body by means of an adhesive.

23. The process according to claim 20 which further comprises a step of subjecting the nonwoven glass fiber member to a silane coupling treatment.

24. The process according to claim 20, wherein prior to conducting the step (b), a step of arranging a mesh member on the surface protective film of the stacked body through a release member is conducted.

* * * * *